June 23, 1959 A. I. ARONSON 2,892,045

CLASS B TRANSISTOR AMPLIFIER

Filed Feb. 1, 1956

INVENTOR.

*Albert I. Aronson*

BY *H. C. Muston*

ATTORNEY.

United States Patent Office 2,892,045

Patented June 23, 1959

2,892,045

CLASS B TRANSISTOR AMPLIFIER

Albert I. Aronson, Collingswood, N.J., assignor to Radio Corporation of America, a corporation of Delaware Application February 1, 1956, Serial No. 562,882

6 Claims. (Cl. 179—171)

Figure 1:
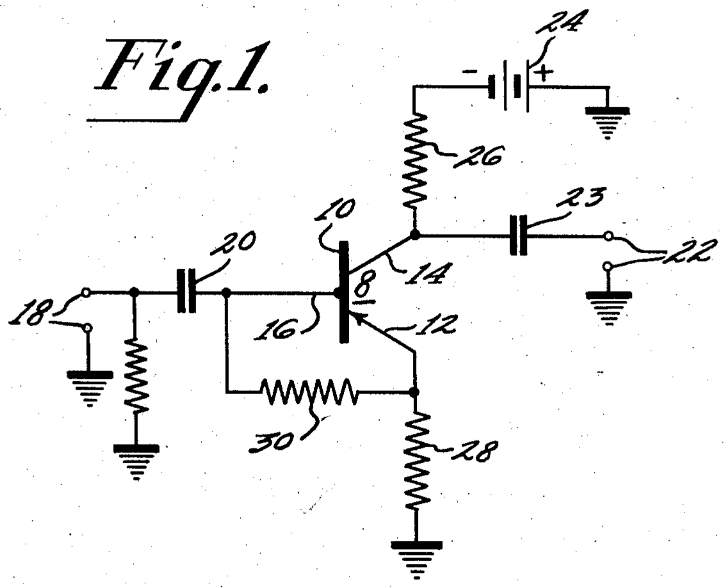

This invention relates in general to transistor signal amplifier circuits, and in particular to class B amplifier circuits of that type.

In many signal translating systems, signal amplifier circuits connected for class B operation are preferred because of their relatively high efficiency and large power output. For example, a pair of electron discharge devices or transistors may be connected for class B push-pull operation where relatively large power output is desired, as in the audio frequency output stage of a signal receiver. The driving or exciting source for a class B transistor amplifier circuit may be capacitance coupled to the input circuit of the transistor output stage. One of the disadvantages of this type coupling is that the coupling capacitor or capacitors charge in a direction which biases the output transistor (or transistors, in the case of the push-pull stage) in the reverse direction because of the rectification characteristic of the base-to-emitter paths of transistors. This results in undesired distortion of the output signal. Ideally, the input impedance of a class B stage should be relatively linear.

Accordingly, it is an object of the present invention to provide substantially distortion-free class B signal amplifying operation in a transistor signal amplifier circuit.

It is a further object of the present invention to provide an improved capacitively coupled push-pull transistor signal amplifier circuit of the class B type which is adapted for substantially distortion-free operation.

It is yet another object of the present invention to provide an improved capacitively-coupled class B transistor signal amplifier circuit wherein the input impedance of the circuit is substantially linear to effectively eliminate signal-induced bias voltage variations on the transistor thereof.

It is a still further object of the present invention to provide an improved capacitively-coupled push-pull or balanced power signal amplifier circuit of the class B type utilizing transistors which enables distortion-free push-pull amplification action without transformer coupling.

In accordance with the invention, means are provided for maintaining a substantially linear input impedance for a class B transistor amplifier circuit in which input signals are applied through a coupling capacitor to the base of a transistor. This means includes a degenerative input impedance control resistor which is serially connected between the emitter and ground for the circuit, and a second input impedance control resistor which is connected between the base electrode and the junction of the first resistor and the emitter electrode. By such a connection, the input impedance of the amplifier circuit is maintained substantially linear, and the signal-induced bias due to charging of the input coupling capacitor is effectively controlled to provide substantially distortion-free signal amplifying operation.

Figure 2:
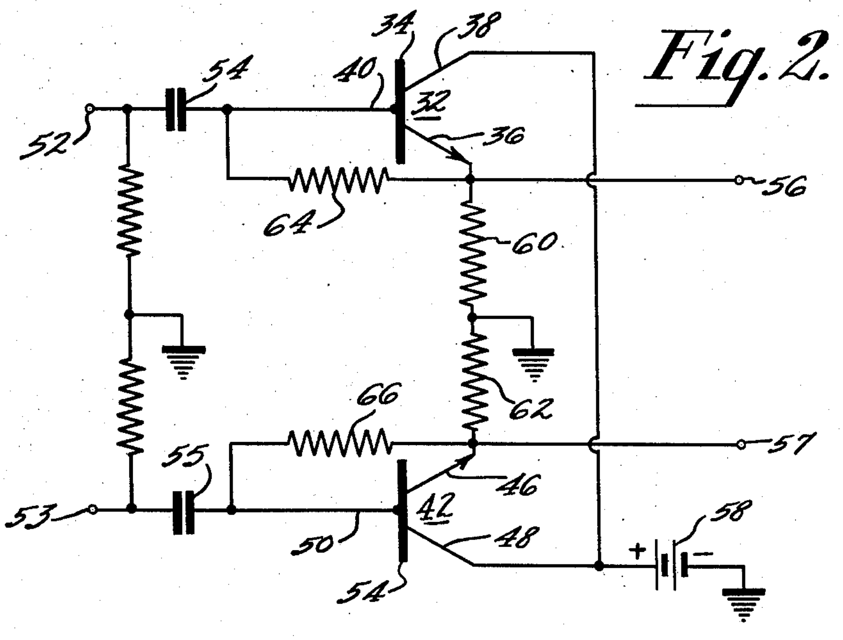

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor signal amplifier connected for class B signal amplifying operation and embodying the present invention, and Figure 2 is a schematic circuit diagram of a class B transistor push-pull amplifier circuit embodying the present invention.

Referring now to the drawing, wherein like elements are indicated by like reference numerals in both figures, and referring particularly to Figure 1, a transistor 8 comprises a semi-conductive body 10 and three electrodes, which are designated as an emitter 12, a collector 14, and a base 16. The transistor 8 may be considered to be of the P–N–P junction type, although other types may be used, and transistors of an opposite conductivity type may also be used as will be seen from a consideration of Figure 2. The input circuit for the transistor 8 includes a pair of input terminals 18, one of which is grounded as shown. The ungrounded input terminal 18 is connected through a coupling capacitor 20 to the input or base electrode 16 of the transistor 8. The output circuit for the transistor 8 includes a pair of output terminals 22, one of which is grounded and the other of which is connected through a coupling capacitor 23 to the output or collector electrode 14 of the transistor 8. For some applications, it may be preferable to derive the output signal from the emitter 12 of the transistor 8. For these applications, the coupling capacitor is connected directly to the emitter in the same manner as shown for the collector electrode. To provide collector biasing potential for the transistor 8 and class B signal amplifying operation of the circuit, a battery 24 is provided, the positive terminal of which is grounded and the negative terminal of which is connected through a load resistor 26 to the collector 14. The collector biasing voltage is selected so that the transistor 8 is conductive on negative half-cycles of the input signal.

To provide a linear input characteristic for the transistor 8, in accordance with the present invention, a first input impedance control resistor 28 is serially connected between the emitter 12 and a common point in the circuit, illustrated as ground for the amplifier circuit, and a second input impedance control resistor 30 is connected between the base 16 and the junction of the emitter 12 and the first resistor 28. By connecting control resistors 28 and 30 in the circuit as shown and described, distortion of the output signal arising from the non-linear characteristic of the input circuit is substantially eliminated. That is to say, the input impedance of the amplifier circuit is maintained substantially linear, which effectively controls any bias that would otherwise tend to be created by the charging of the input capacitor 20 upon application of an input signal.

The input impedance of the circuit between the input capacitor 20 and ground may be analyzed as follows:

$$Z_{\text{in}_1} \cong \frac{(R_{30})(R_{\text{in}})}{R_{30}+R_{\text{in}}} + \beta R_{28}$$

where:

$Z_{in_1}$=input impedance during conduction (negative half-cycles of applied input signal);

$R_{in}$=input or emitter-to-base resistance of transistor 8;

$R_{28}$=resistance of resistor 28;

$R_{30}$=resistance of resistor 30; and $\beta$=current gain between the base and collector electrodes.

$$Z_{\text{in}_2} \cong (R_{30}) + (R_{28})$$

where:

$Z_{in_2}$=input impedance during cutoff (positive half-cycles of applied input signal).

To achieve the desired linear input impedance characteristic, $Z_{in_1}$ should be equal or substantially equal to $Z_{in_2}$. By equating these two inmedances, appropriate resistance values for the resistors 28 and 30 may be determined as follows:

$$R_{28}=\frac{R_{30}^2}{\beta(R_{30}+R_{in})-R_{30}+R_{in}}$$

By selecting the resistance values for the control resistors in accordance with the foregoing formulas, a substantially linear input characteristic may be achieved. It is also noted that for maximum power gain, the resistance of the resistor 30 should be equal to the emitter-to-base resistance of the transistor ($R_{in}$). For maximum power transfer, therefore:

$$R_{28}=\frac{R_{in}}{2\beta}$$

In operation, if it is assumed that a negative half-cycle of signal is applied to the input terminals 18, the input impedance of the transistor 8 will be relatively low. A positive charge with respect to the base and the emitter will accumulate on capacitor 20. In the conventional circuit arrangement this charge will bias the base and emitter electrodes in the reverse direction resulting in signal distortion. A half sinewave which is an amplified version of the input signal will then appear in the collector 14 and may be derived from the output terminals 22. During the next half-cycle of signal (i.e., the positive half-cycle), on the other hand, the input impedance of the transistor 8 will be high, and the capacitor 20 will discharge through the resistors 30 and 28. Due to the linear input characteristic obtained in accordance with the invention, rectification of the input signal will not occur and distortion of the half sine-wave output signal will be minimized. In this manner, proper biasing for class B amplification action is fulfilled at all signal levels and the transistor 8 will conduct for 180° of each cycle.

In Figure 2, reference to which is now made, a class B push-pull amplifier circuit embodying the invention comprises a pair of N–P–N junction transistors 32 and 42, each comprising a semi-conductive body 34 and 44 and an emitter 36 and 46, a collector 38 and 48, and a base 40 and 50, respectively. While the transistors 32 and 42 may be considered to be junction transistors of the N–P–N type, other type transistors may be used, as may transistors of an opposite conductivity type. The input circuit for the push-pull transistor amplifiers includes a pair of input terminals 52 and 53, which may be connected to a phase inverting driver source (not shown) and which are respectively connected through coupling capacitors 54 and 55 to the base electrodes 40 and 50 of the transistors 32 and 42. The output circuit for the transistors 32 and 42 includes a pair of output terminals 56 and 57 which are respectively connected to the output or emitter electrodes 36 and 46 of the transistors 32 and 42. It should be understood, however, that the output signal may be derived, if desired, from the collector electrodes 38 and 48 of the transistors 32 and 42. The emitters 36 and 46, which in this embodiment of the invention are output electrodes, are connected through load resistors 60 and 62, respectively to ground as shown. To provide collector biasing potentials for the transistors for class B operation of the amplifier circuit, a battery 58 is provided. The negative terminal of the battery 58 is grounded, while its positive terminal is connected directly with the collectors 38 and 48 of the transistors 32 and 42, respectively. The collector electrodes in this embodiment of the invention are common to both the input and output circuits. This is in contrast to Figure 1, wherein the emitter electrode is common to the input and output circuits.

In accordance with the present invention, class B operation of the push-pull amplifier circuit with minimum distortion is provided by connecting a first input impedance control resistor 64 in series between the base 40 of the transistor 32 and the junction of the emitter electrode 36 and the resistor 60, and a second input impedance control resistor 66 in series between the base 50 of the second transistor 42 and the junction of the emitter 46 and the resistor 62. In this manner, a substantially linear input impedance for both transistors is maintained in much the same manner as described in connection with Figure 1. The resistance values of these control resistors may be selected in the same manner as described in Figure 1. If the output signal is derived from the emitter electrodes as shown, and the emitters are coupled to the input electrodes of a pair of push-pull output transistors, for example, the input impedance of the output transistors would have to be considered in determining the correct resistance values for the control resistors.

Incoming signals from a phase inverting driver source, as was explained hereinbefore, are applied to the push-pull amplifier circuit of Figure 2 by way of the input terminals 52 and 53. If it is assumed that a positive half-cycle of signal is applied to the base 40 of the output transistor 32 through the coupling capacitor 54, a half-cycle amplified version of this signal will appear in the emitter 36 and may be derived from the output terminal 56. At the same time, the negative half-cycle of the signal is coupled through the coupling capacitor 55 to the base 50 of the other push-pull transistor 42. The impedance of the transistor 42 will be high during this cycle, and the transistor 42 will be non-conductive. During the next 180° of the signal, the polarity of the signal which is applied to each transistor will be reversed, and the transistor 42 will conduct, while the transistor 32 will be non-conductive. A push-pull output signal may thus be derived from the output terminals 56 and 57. Since the impedances between the coupling capacitors and ground are maintained substantially linear as described in connection with Figure 1, the amplified push-pull output signal will be substantially distortion-free. Accordingly, undesirable distortion due to the nonlinear input characteristics of the push-pull stage is prevented, thus insuring faithful reproduction of the applied signal. For this reason, the circuits embodying the invention may find wide use wherever the advantages of capacity coupling to a class B stage are desired.

While it will be understood that the circuit specifications may vary according to the design for any particular application, the following circuit specifications are included for the circuit of Figure 2 by way of example only:

| | |
|---|---|
| Capacitors **54** and **55** | 10 microfarads each. |
| Resistors **60**, **62**, **64**, and **66** | 27; 27; 2000; and 2000 ohms, respectively. |
| Battery **58** | 6 volts. |

These circuit specifications are appropriate for use with a commercial transistor of a 2N104 type having an input resistance ($R_{in}$) of 2000 ohms and a current gain factor ($\beta$) of 40.

What is claimed is:

1. In a class B signal amplifier circuit, the combination comprising, a transistor including base, emitter, and collector electrodes, means providing direct current energizing potentials for biasing said transistor for class B signal amplifying operation, capacity coupling means connected for applying an input signal to the base electrode of said transistor, means for deriving an output signal between the collector and emitter electrodes of said transistor, a first resistor connected in series between said emitter electrode and a common point in said circuit, and a second resistor serially connected between said base electrode and the junction of said emitter electrode and said first resistor, the resistance values of said first resistor being substantially equal to:

$$R_1=\frac{R_2^2}{\beta(R_2+R_{in})-R_2+R_{in}}$$

where:

$R_1$=resistance of said first resistor,
$R_2$=resistance of said second resistor,
$R_{in}$=input resistance of said transistor, and
$\beta$=current gain between the base and collector electrodes to provide a substantially linear input impedance and substantially distortion-free signal amplifying operation of said amplifier circuit.

2. In a class B push-pull signal amplifying circuit, the combination comprising, a first and a second transistor each including base, emitter, and collector electrodes, said transistors being of the same conductivity type, capacity coupling means for applying an input signal in push-pull to the transistor base electrodes, means for deriving a push-pull output signal from the transistor emitter electrodes, means providing a direct current source of biasing potential serially connected with the transistor collector electrodes for applying biasing potentials thereto, a first impedance control resistor connected in series between the emitter electrode of said first transistor and a common point in said circuit, a second impedance control resistor connected in series between the emitter electrode of said second transistor and said common point, a third impedance control resistor having resistance of a magnitude relative to the resistance of said first resistor and the base-to-emitter resistance of said first transistor to provide a substantially linear input impedance for said first transistor connected in series between the base electrode of said first transistor and the junction of the emitter electrode of said first transistor and said first resistor, and a fourth impedance control resistor having resistance of a magnitude relative to the resistance of said second resistor and the base-to-emitter resistance of said second transistor to provide a substantially linear input impedance for said second transistor connected in series between the base electrode of said second transistor and the junction of the emitter electrode of said second transistor and said second resistor.

3. In a class B push-pull signal amplifying circuit, the combination comprising, a first and a second transistor each including base, emitter, and collector electrodes, capacity coupling means for applying an input signal to said base electrodes, means for deriving an output signal between said collector and emitter electrodes, a first impedance control resistor connected in series between the emitter electrode of said first transistor and a common point in said circuit, a second impedance control resistor connected in series between the emitter electrode of said second transistor and said common point, a third impedance control resistor connected in series between the base electrode of said first transistor and the junction of the emitter electrode of said first transistor and said first resistor to provide a substantially linear input impedance for said first transistor, and a fourth impedance control resistor connected in series between the base electrode of said second transistor and the junction of the emitter electrode of said second transistor and said second resistor, said control resistors being related in resistance value to provide substantially linear input impedance for said second transistor.

4. A transistor amplifier circuit comprising, in combination, at least one transistor including base, emitter, and collector electrodes, means connected for biasing said transistor for class B operation including a direct-current bias supply source having a pair of terminals, means connecting said collector electrode with one of said terminals, a first resistor directly connected between said emitter electrode and the other of said terminals, an input terminal, means including a coupling capacitor connecting said input terminal with said base electrode, means providing a substantially linear input impedance for said amplifier circuit to control signal induced bias across said capacitor and prevent crossover distortion including a second resistor of greater resistance than said first resistor and of a value wherein the input impedance of said transistor during conduction is approximately equal to the input impedance thereof during cut off, said second resistor being directly connected between said base electrode and the junction of said emitter electrode and said first resistor, and means connected for deriving an output signal between said collector and emitter electrodes.

5. A transistor amplifier circuit as defined in claim 4 wherein the resistance of said second resistor is approximately equal to the input resistance of said transistor.

6. A transistor amplifier circuit comprising, in combination, at least one transistor including base, emitter, and collector electrodes, means connected for biasing said transistor for class B operation including a direct-current bias supply source having a pair of terminals, means connecting said collector electrode with one of said terminals, a first resistor connected between said emitter electrode and the other of said terminals, means including a coupling capacitor connected for applying an input signal to said base electrode, a second resistor having a resistance value approximately equal to the input resistance of said transistor and greater than the resistance of said first resistor direct-current conductively connected between said base electrode and the junction of said emitter electrode between said base electrode and the junction of said emitter electrode and said first resistor to provide a substantially linear input impedance for said transistor, and means connected for deriving an output signal between said collector and emitter electrodes.

References Cited in the file of this patent

UNITED STATES PATENTS

| | | |
|---|---|---|
| 2,652,460 | Wallace | Sept. 15, 1953 |
| 2,791,645 | Bessey | May 7, 1957 |

OTHER REFERENCES

Germany, App. Serial No. N10190, printed January 26, 1956.

Sulzer article, "Electronics," August 1953, p. 171. (Copy in 179–171–MB.)

Holmes et al.: Article, Proc. IRE June 1955, (Copy in 179–171–MB) pp. 660–670.

Freedman et al.: Article, Proc. IRE June 1955, pp. 671–678. (Copy in 179–171–MB.)